United States Patent [19]
Kobayashi

[11] Patent Number: 5,476,809
[45] Date of Patent: Dec. 19, 1995

[54] SEMICONDUCTOR DEVICE AND METHOD OF MANUFACTURING THE SAME

[75] Inventor: Kenya Kobayashi, Tokyo, Japan

[73] Assignee: NEC Corporation, Tokyo, Japan

[21] Appl. No.: 242,085

[22] Filed: May 13, 1994

[30] Foreign Application Priority Data

May 22, 1993 [JP] Japan ................... 5-142966

[51] Int. Cl.$^6$ ............................................. H01L 21/76
[52] U.S. Cl. ................... 437/62; 437/90; 437/99; 148/DIG. 12
[58] Field of Search ................... 437/62, 90, 99; 148/DIG. 12

[56] References Cited

U.S. PATENT DOCUMENTS

| | | | |
|---|---|---|---|
| 3,913,124 | 10/1975 | Roberson | 437/99 |
| 3,966,577 | 6/1976 | Hochberg | 437/62 |
| 4,473,598 | 9/1984 | Ephrath et al. | 437/90 |
| 4,908,328 | 3/1990 | Hu et al. | 437/63 |
| 4,948,748 | 8/1990 | Kitahara et al. | 148/DIG. 12 |
| 4,963,505 | 10/1990 | Fujii et al. | 437/99 |
| 5,223,450 | 6/1993 | Fujino et al. | 437/62 |
| 5,356,821 | 10/1994 | Naruse et al. | 437/99 |

FOREIGN PATENT DOCUMENTS

| | | | |
|---|---|---|---|
| 61216340 | 9/1986 | Japan | 437/62 |
| 2065370 | 6/1981 | United Kingdom | 437/62 |
| WO9326041 | 12/1993 | WIPO | 148/DIG. 12 |

OTHER PUBLICATIONS

Ohata et al., "Dielectrically Isolated Intelligent Power Switch," IEEE Custom Integrated Circuits Conference pp. 443–446 (1987).

*Primary Examiner*—George Fourson
*Attorney, Agent, or Firm*—Popham, Haik, Schnobrich & Kaufman, Ltd.

[57] ABSTRACT

This invention relates to a semiconductor device which comprises a monocrystalline silicon substrate, a first insulating film formed in a first region on one major surface of the monocrystalline silicon substrate, a first monocrystalline silicon layer formed on the first insulating film, a second insulating film covering a side surface of the first monocrystalline silicon layer, a first polysilicon layer formed to cause a side surface of the first polysilicon layer to contact the second insulating film, and a second monocrystalline silicon layer, having a side surface contacts the first polysilicon layer, formed in a second region of the one major surface of the monocrystalline silicon substrate, and dielectrically isolated from the first monocrystalline silicon layer, and a method of manufacturing the same.

6 Claims, 5 Drawing Sheets

FIG. 4
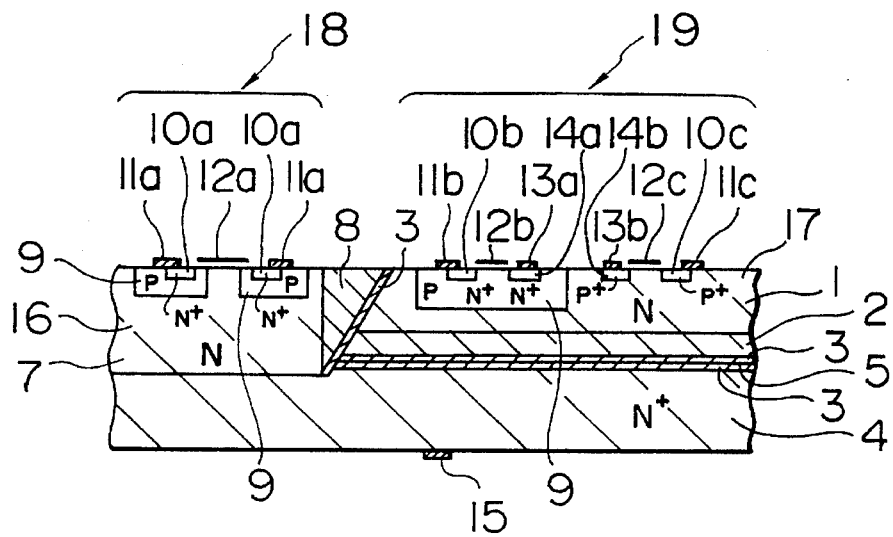
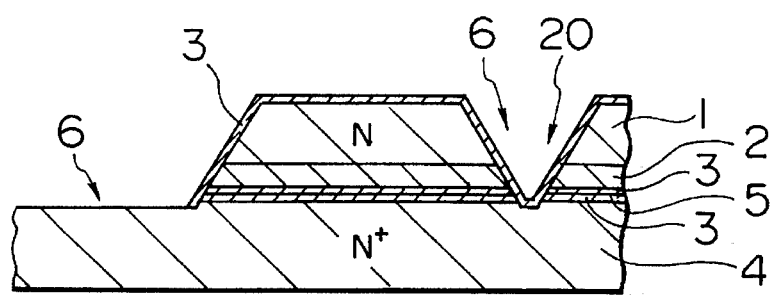
FIG.5A
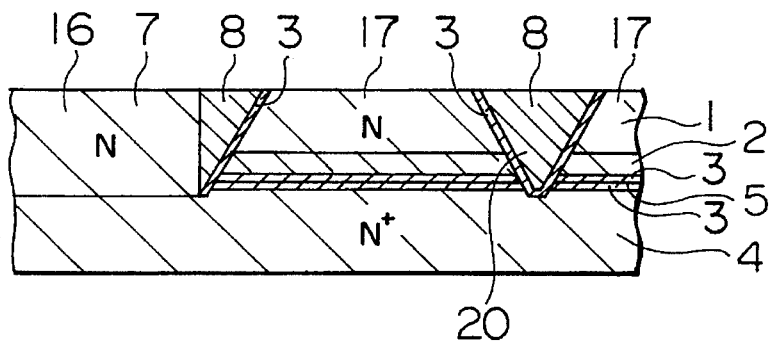
FIG.5B

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, to a semiconductor substrate having a dielectric isolation structure and a method of manufacturing the same.

2. Description of the Prior Art

In conventional techniques for monolithically integrating a control circuit element and a high-breakdown-voltage, large-current power element having a current path from the upper surface of a semiconductor substrate to the lower surface thereof, as a technique for forming a power element formation region using an epitaxial method, a bonded substrate using the element isolation method as shown in FIGS. 1A to 1E and FIG. 2 is proposed in the CICC of IEEE 1987, and Japanese Patent Laid-Open No. 3-34347 (corresponding to U.S. Pat. No. 4,908,328).

An example of the conventional technique will be described hereinafter with reference to FIGS. 1A to 1E.

As shown in FIG. 1A, oxide films 3 are formed on one surface of an n-type first monocrystalline silicon substrate 1 having an n+-type heavily doped impurity layer 2, and one surface of an n+-type second monocrystalline silicon substrate 4 having a higher impurity concentration than that of the first monocrystalline silicon substrate 1, respectively.

As shown in FIG. 1B, the surfaces on which the oxide films 3 are formed are bonded to each other by a bonding technique. (Reference numeral 5 denotes a bonding surface in FIG. 1B.)

Subsequently, as shown in FIG. 1C, etching is performed from the upper surface of the first monocrystalline silicon substrate 1 exceeding the bonding surface 5 so as to reach the second monocrystalline silicon substrate 4. (Reference numeral 6 denotes an epitaxial layer formation region in FIG. 1C.)

As shown in FIG. 1D, an n-type monocrystalline silicon epitaxial layer 7 having an optimal concentration for formation of a power element is grown on the etched surface.

Thereafter, as shown in FIG. 1E, a trench groove 27 which reaches the oxide film 3 present on the bonding surface 5 is formed by the anisotropic reactive ion etching (RIE) method. After an oxide film 3 is formed inside the trench groove 27, polysilicon 28 is filled in the trench groove 27, thereby isolating the dielectric.

With this arrangement, a vertical power element can be formed in the monocrystalline silicon epitaxial layer 7 (power element formation region 16) electrically connected to the second monocrystalline silicon substrate 4, and a control circuit element can be formed in a region (control circuit element formation region) 17 dielectrically isolated by the oxide film 3 present on the bonding surface 5 and the oxide film 3 formed inside the trench groove 27 (see FIG. 1E).

Another example of the conventional technique which is difference from that of the conventional technique shown in FIGS. 1A to 1E will be described with reference to FIG. 2.

Note that, in FIG. 2, reference numerals 29 and 30 denote a p-type isolation diffusion layer and an n+-type monocrystalline epitaxial layer, respectively, and other reference numerals denote the same parts in the conventional example shown in FIGS. 1A to 1E.

In this example of the conventional technique, as shown in FIG. 2, the p-type isolation diffusion layer 29 which reaches an oxide film 3 present on a bonding surface 5 is formed from the upper surface of an n-type first monocrystalline silicon substrate 1. A control circuit element and a power element are isolated from each other by a p-n junction isolation.

When a power element having a current path from the upper surface of a silicon substrate to the lower surface thereof and a control circuit element are monolithically integrated, isolation between elements by a p-n junction as in FIG. 2 has a drawback in that it is greatly difficult to realize a high breakdown voltage.

According to the conventional techniques shown in FIGS. 1A to 1E and FIG. 2, after the power element formation region 16 is formed using an epitaxial method, the control circuit element formation region 17 is isolated from the power element formation region 16. For this reason, the trench groove 27, the oxide film 3, and the polysilicon 28 need to be formed (see FIG. 1E), or the isolation diffusion layer 29 needs to be formed (see FIG. 2). This complicates the manufacturing processes, and also results in high cost.

SUMMARY OF THE INVENTION

The present invention has been made in consideration of the above drawbacks and problems of the conventional techniques, and has as its object to solve the above drawbacks and problems of the conventional techniques, and to provide a semiconductor device which can facilitate the manufacture of a semiconductor substrate having a dielectric isolation structure for monolithically integrating a control circuit element and a power element having a current path from the upper surface of the substrate to the lower surface thereof, and a method of manufacturing the same.

In order to achieve the above object, according to the main aspect of the present invention, there is provided a semiconductor device which comprises a monocrystalline silicon substrate, a first insulating film formed in a first region on one major surface of the monocrystalline silicon substrate, a first monocrystalline silicon layer formed on the first insulating film, a second insulating film covering a side surface of the first monocrystalline silicon layer, a first polysilicon layer formed to cause a side surface of the first polysilicon layer to contact the second insulating film, and a second monocrystalline silicon layer, having a side surface contacting the first polysilicon layer, formed in a second region of the one major surface of the monocrystalline silicon substrate, and dielectrically isolated from the first monocrystalline silicon layer.

According to the second aspect of the present invention, there is provided a semiconductor device, described in the main aspect, wherein a plurality of isolating areas are formed in the first monocrystalline silicon layer by filling polysilicon layers in a plurality of grooves each having a third insulating film on its side wall so as to form a plurality of regions dielectrically isolated from each other by the grooves in the first monocrystalline silicon layer.

According to the third aspect of the present invention, there is provided a semiconductor device, described in the main aspect, which further comprises a control circuit element formed in the first monocrystalline silicon layer, and a vertical power element electrically connected to the monocrystalline silicon substrate and formed in the second monocrystalline silicon layer.

According to the fourth aspect of the present invention, there is provided a method of manufacturing a semiconductor device which comprises:

(1) the step of forming a first insulating film on at least one of one major surface of a first monocrystalline silicon substrate and one major surface of a second monocrystalline silicon substrate;

(2) the step of directly joining one major surface of the first monocrystalline silicon substrate and one major surface of the second monocrystalline silicon substrate and annealing a resultant structure, thereby forming a bonded silicon substrate having the first insulating film on a contact surface;

(3) the step of forming a first groove from the other major surface of the first monocrystalline silicon substrate of the bonded silicon substrate, extending through the first insulating film to reach one major surface of the second monocrystalline silicon substrate;

(4) the step of forming a second insulating film on a side wall of the first groove;

(5) the step of forming a silicon layer on a surface of the bonded silicon substrate having the first groove using an epitaxial method, so that a monocrystalline silicon layer is formed above the first groove and a polysilicon layer is formed on the second insulating film formed on the side wall of the first groove; and (6) the step of polishing a resultant surface of the bonded silicon substrate to obtain a flat surface;

thereby forming an island-like element formation region dielectrically isolated from another region by the first and second insulating films on the first monocrystal silicon substrate.

According to the fifth aspect of the present invention, there is provided a method of manufacturing a semiconductor device, described in the fourth aspect, wherein the step of forming the first groove from the other major surface of the bonded silicon substrate comprises the steps of:

(a) forming a plurality of second grooves in a region on the other major surface of the first monocrystalline silicon substrate on which the island-like element formation region is to be formed, at the same time when the first groove is formed;

(b) forming third insulating films on side walls and bottoms of the plurality of second grooves at the same time when the second insulating films is formed;

(c) forming a polysilicon layer on the third insulating film; and (d) polishing a resultant surface of the bonded silicon substrate to obtain a flat surface;

thereby forming respective island-like element formation regions dielectrically isolated from each other by the third insulating films in the island-like element formation region on the first monocrystalline silicon substrate.

According to the sixth aspect of the present invention, there is provided a method of manufacturing a semiconductor device, described in any one of the fourth and fifth aspects, wherein the first monocrystalline silicon substrate is a silicon substrate of one conductivity type, and the second monocrystalline silicon substrate is a silicon substrate of one conductivity type having a higher impurity concentration than that of the first monocrystalline silicon substrate.

According to the seventh aspect of the present invention, there is provided a method of manufacturing a semiconductor device, described in any one of the fourth to sixth aspects, wherein an impurity region of one conductivity type having a higher impurity concentration than that of the first monocrystalline silicon substrate is formed on one major surface of the first monocrystalline silicon substrate before the first insulating film is formed.

According to the present invention as described in the above aspects, when the monocrystalline silicon epitaxial layer as a prospective power element formation region is to be formed, the power element formation region and the control circuit element formation region are isolated from each other by the insulating film formed on the side wall of the groove and the insulating film present on the bonding surface, thereby facilitating the manufacture of the device.

In addition, the island-like regions for forming respective elements in the control circuit element formation region can be formed by the same numbers of steps.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIG. 4 is a sectional view wherein a power element and a control circuit element are formed on the SOI substrate according to the first embodiment of the present invention;

FIGS. 5A and 5B are sectional views in an order of manufacturing steps showing a method of manufacturing an SOI substrate according to the second embodiment of the present invention;

DETAILED DESCRIPTION OF PREFERRED EMBODIMENTS

The present invention will be described in more detail hereinafter with reference to several preferred embodiments shown in the accompanying drawings (FIGS. 3A to 7B).

Figure 6:
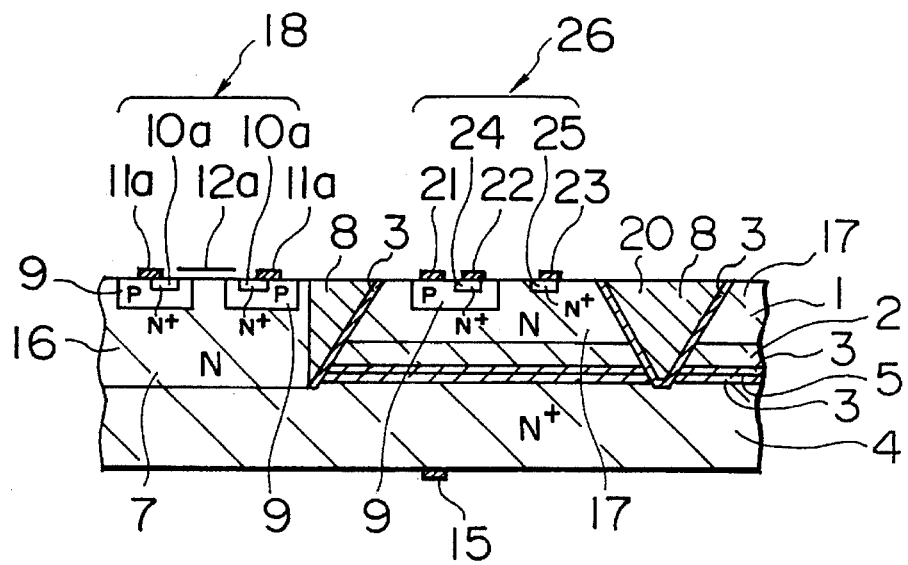
FIG. 6 is a sectional view wherein a power element and a control circuit element are formed on the SOI substrate according to the second embodiment of the present invention.
Figure 7A:
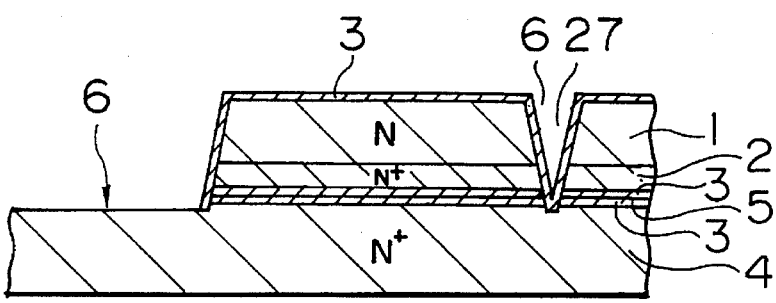
FIGS. 7A and 7B are sectional views in an order of manufacturing steps showing a method of manufacturing an SOI substrate according to the third embodiment of the present invention.
Figure 7B:
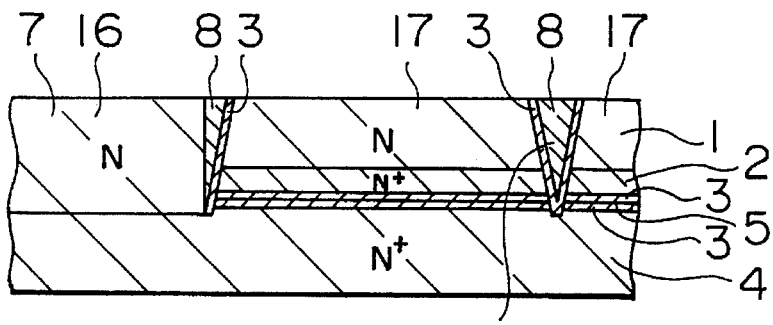

The present invention will be described in detail hereinafter with reference to FIGS. 3 to 5. Note that FIGS. 3A to 3E and FIG. 4 are views for explaining the first embodiment of the present invention, FIGS. 5A, 5B and 6 are views for explaining the second embodiment thereof, and FIGS. 7A and 7B are views for explaining the third embodiment thereof.

FIGS. 3A to 3E are sectional views in an order of manufacturing steps showing a method of manufacturing an SOI substrate according to the first embodiment of the present invention.

Figure 1A:
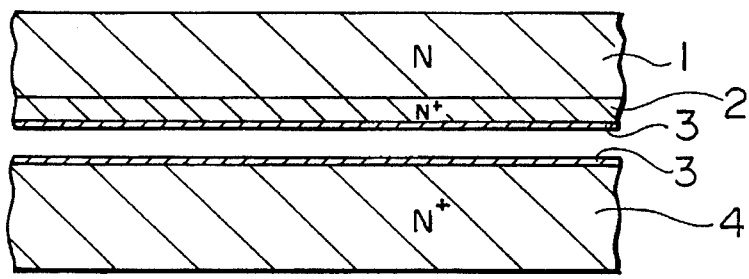
FIGS. 1A to 1E are sectional views in an order of manufacturing steps showing an example of a conventional technique and a method of manufacturing the same.
Figure 1B:
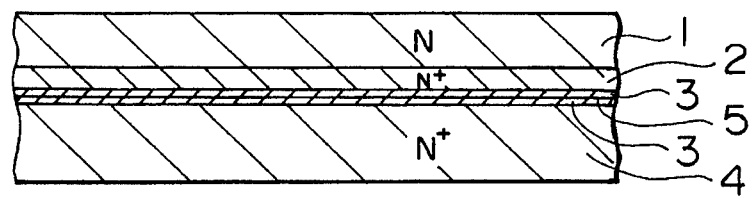
Figure 1C:
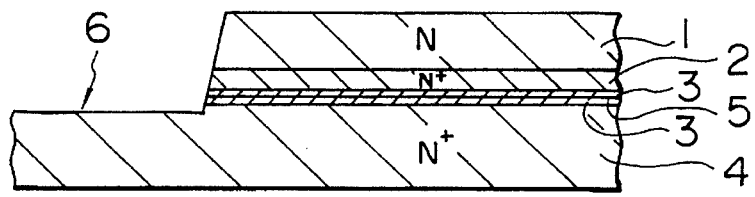
Figure 1D:
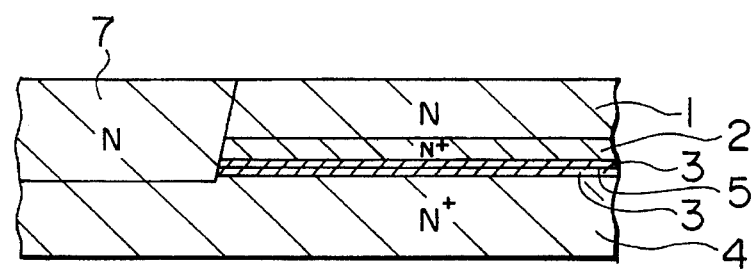
Figure 1E:
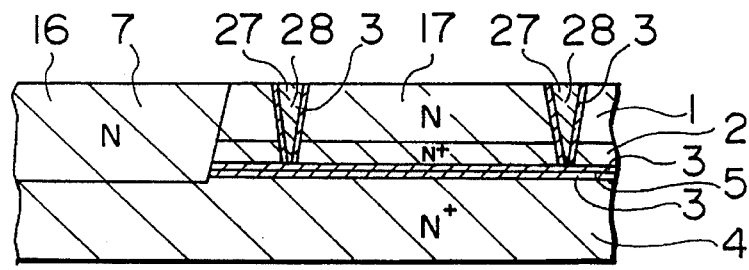
Figure 2:
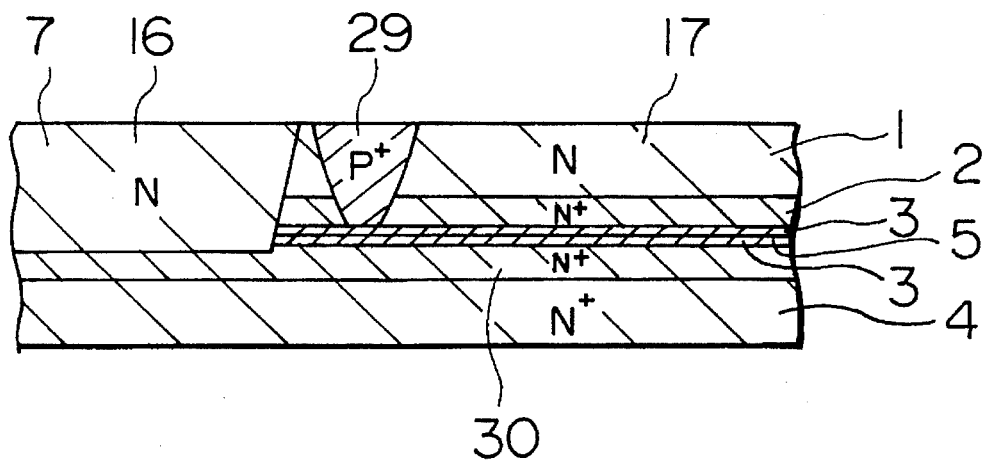
FIG. 2 is a sectional view showing another example of the conventional technique.
Figure 3A:
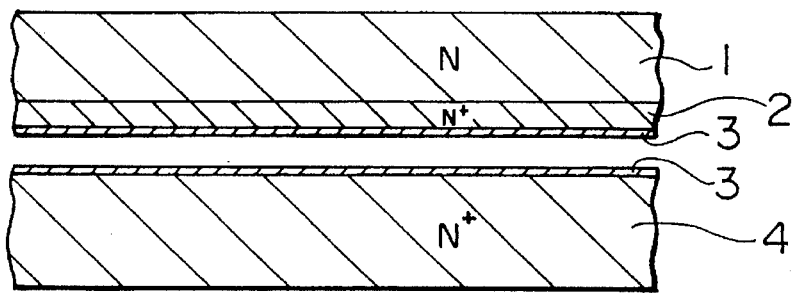
FIGS. 3A to 3E are sectional views in an order of manufacturing steps showing a method of manufacturing an SOI substrate according to the first embodiment of the present invention.

As shown in FIG. 3A, oxide films 3 are formed on one major surface of an n-type first monocrystalline silicon substrate 1 and one major surface of an n+-type second monocrystalline silicon substrate 4 using, e.g., the CVD method.

According to the present bonding technique, however, since both the junction between the surface of an oxide film and the surface of single crystal, and the junction between the surfaces of the oxide films can be formed, the oxide film 3 may be formed on only any one of the substrates.

In addition, an n+-type heavily doped impurity layer 2 is formed on the one major surface of the first monocrystalline silicon substrate 1. However, since the heavily doped impurity layer 2 is a buffer layer in a control circuit element formation region 17 (to be described below in FIG. 3E), it may not be formed.

Figure 3B:
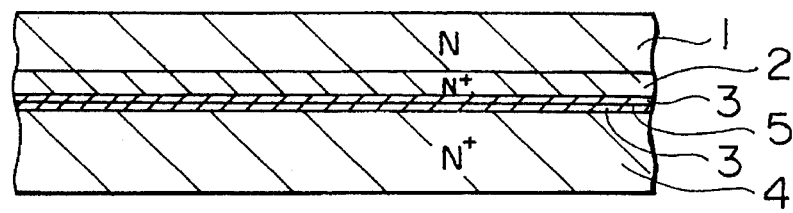

As shown in FIG. 3B, the surfaces, on which the oxide films 3 are formed, of the first monocrystalline silicon substrate 1 and the second monocrystalline silicon substrate 4 are directly joined to each other by a bonding method, and the resultant structure is then annealed at 1,100° C. for 2 hours to form one bonded substrate. (Reference symbol 5 denotes a bonding surface in FIG. 3B.)

Figure 3C:
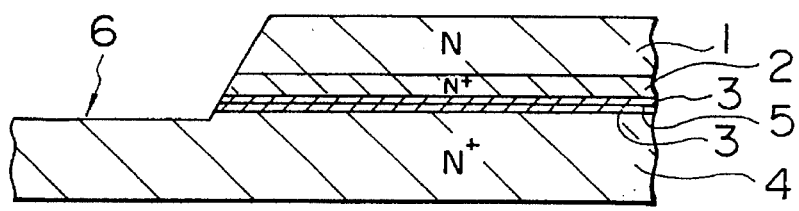

Subsequently, as shown in FIG. 3C, the other major surface of the first monocrystalline silicon substrate 1 is patterned, and then partially etched by anisotropic alkaline etching or reactive ion etching (RIE), thereby forming a groove having a depth by which the oxide films present on the bonding surface 5 are completely removed. This groove is designated as an epitaxial layer formation region 6.

Figure 3D:
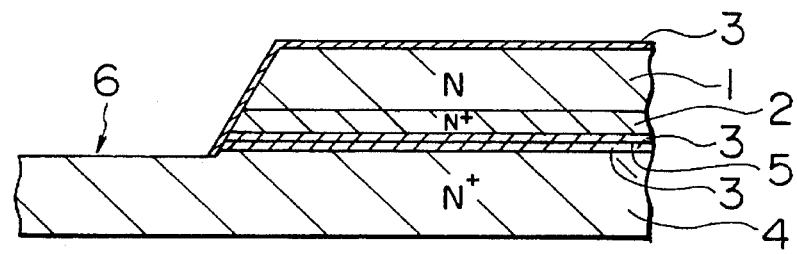

As shown in FIG. 3D, after an oxide film 3 is formed on the etched surface of the first monocrystalline silicon substrate 1 including the groove as the epitaxial layer formation region 6, the oxide film 3 is removed from the bottom of the groove as the epitaxial layer formation region 6 by etching using a resist mask.

Figure 3E:
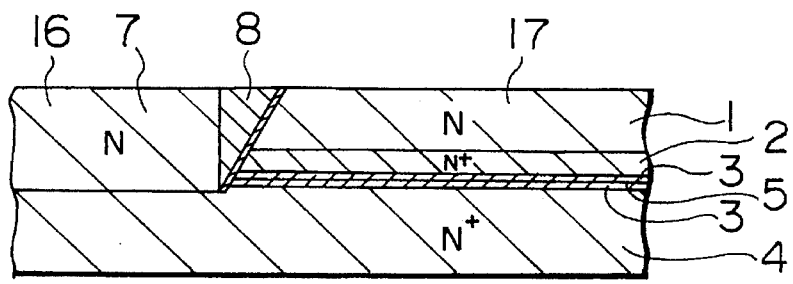

As shown in FIG. 3E, silicon is epitaxially grown to form a monocrystalline silicon epitaxial growth layer 7 on the monocrystalline silicon surface as the bottom of the epitaxial layer formation region 6, and a polysilicon epitaxial growth layer 8 on the oxide film 3, respectively. Then, polishing is performed until the other major surface of the first monocrystalline silicon substrate 1 appears so as to obtain a flat upper surface.

According to the steps shown in FIGS. 3A to 3E, an SOI substrate can be obtained which has a power element formation region 16 consisting of the second monocrystalline silicon substrate 4 and the monocrystalline silicon epitaxial growth layer 7 electrically connected to the second monocrystalline silicon substrate 4, and an island-like control circuit element formation region 17, whose bottom and side surfaces are surrounded by the oxide film 3, dielectrically isolated from the power element formation region 16 (see FIG. 3E).

FIG. 4 is a sectional view wherein the power element and the control circuit element are formed on the SOI substrate obtained in the first embodiment of the present invention.

Referring to FIG. 4, a vertical power MOSFET 18 is formed in the power element formation region 16. A p-type base region 9 and an n+-type source region 10a are formed from the upper surface of the n-type monocrystalline silicon epitaxial growth layer 7, and a source electrode 11a is formed on the upper surface as an electrode common to both the regions 9 and 10a.

A gate electrode 12a is formed through a gate insulating film, and a lower-surface drain electrode 15 is formed on the other major surface of the n+-type second monocrystalline silicon substrate 4.

On the other hand, a control circuit element formed in the island-like control circuit element formation region 17 is a CMOS 19. A p-type base region 9, an n+-type source region 10b, an n+-drain region 14a, a p+-type source region 10c, and a p+-drain electrode 14b are formed from the upper surface. Source electrodes 11b and 11c and drain electrodes 13a and 13b are formed on the upper surface.

Gate electrodes 12b and 12c are formed through an gate insulating film.

FIGS. 5A and 5B are sectional views in an order of manufacturing steps showing the method of manufacturing an SOI substrate according to the second embodiment of the present invention.

Note that the same reference numerals as in FIGS. 3A to 3E denote the same parts in FIG. 5A and 5B, and a description thereof will be omitted to avoid a repetitive description.

In the second embodiments, as shown in FIG. 5A, a bonded substrate is formed by the same steps as in FIGS. 3A and 3B. Thereafter, the other major surface of a first monocrystalline silicon substrate 1 is patterned, and then partially etched by anisotropic alkaline etching, thereby forming a groove having a large opening and a V-groove 20 having a plurality of small openings, to a depth by which an oxide film 3 present on a bonding surface 5 is completely removed.

This groove having the large opening is designated as an epitaxial layer formation region 6 as in the first embodiment.

After an oxide film 3 is formed on the surface including the grooves, the oxide film 3 is removed from only the bottom of the groove (epitaxial layer formation region 6) having the large opening by etching using a resist mask (see FIG. 5A).

As shown in FIG. 5B, silicon is epitaxially grown to form a monocrystalline silicon epitaxial growth layer 7 on the monocrystalline silicon surface as the bottom of the groove having the large opening, and a polysilicon epitaxial growth layer 8 on the oxide film 3, respectively. Then, polishing is performed until the other major surface of the first monocrystalline silicon substrate 1 appears so as to obtain a flat upper surface.

According to FIGS. 5A and 5B, as in the first embodiment, an SOI substrate can be obtained which has a power element formation region 16 and an island-like control circuit element formation region 17, both of which are dielectrically isolated from each other. Furthermore, the V-groove 20 which is filled with the polysilicon epitaxial growth layer 8 and has the oxide film 3 therein is formed in the control circuit element formation region 17 by the same numbers of steps as in the first embodiment. By the V-groove 20, island-like regions for forming respective elements can be dielectrically isolated.

FIG. 6 is a sectional view wherein a power element and a control circuit element are formed on the SOI substrate in the second embodiment of the present invention.

Referring to FIG. 6, a power MOSFET 18 is formed in the power element formation region 16, as in the first embodiment (see FIG. 4). A description thereof will be omitted to avoid a repetition of the first embodiment.

A bipolar transistor 26 is formed in the control circuit element formation region 17. A p-type base region 9, an n+-type emitter region 24, and an n+-type collector contact region 25 are formed from the upper surface, and a base electrode 21, an emitter electrode 22, and a collector electrode 23 are formed on the upper surface.

The bipolar transistor 26 as a control circuit element is dielectrically isolated by the V-groove 20 which is filled with the polysilicon epitaxial growth layer 8 and has the oxide film 3 therein. For this reason, the bipolar transistor with a high breakdown voltage depending on the oxide film thickness can be obtained without consideration of a latch-up performance.

FIGS. 7A and 7B are sectional views in an order of manufacturing steps showing a method of manufacturing an SOI substrate according to the third embodiment of the present invention.

Referring to FIGS. 7A and 7B, reference numeral 27 denotes a trench groove, and other reference numerals in FIGS. 7A and 7B denote the same parts as in FIGS. 1A to 1E.

In the third embodiment, since the groove is formed using anisotropic reactive ion etching (RIE), the trench groove 27 has a shape shown in FIG. 7A. Note that the step in FIG. 7B is the same as in FIG. 3B.

Basic effects of the operation in the third embodiment are the same as those in the second embodiment. In addition, since the opening of the trench groove 27 is smaller than that of the V-groove 20 (see FIG. 6), a degree of integration of the control circuit element can be improved.

What we claimed is:

1. A method of manufacturing a semiconductor device, comprising:

(1) the step of forming a first insulating film on at least one of one major surface of a first monocrystalline silicon substrate and one major surface of a second monocrystalline silicon substrate;

(2) the step of directly joining said one major surface of said first monocrystalline silicon substrate and said one major surface of said second monocrystalline silicon substrate and annealing the resultant structure, thereby forming a bonded silicon substrate having said first insulating film on a contact surface;

(3) the step of forming a first groove from the other major surface of said first monocrystalline silicon substrate of said bonded silicon substrate, extending through said first insulating film to reach said one major surface of said second monocrystalline silicon substrate;

(4) the step of forming a second insulating film on the side walls of said first groove;

(5) the step of forming a silicon layer on a surface of said bonded silicon substrate having said first groove using an epitaxial method, so that a monocrystalline silicon layer is formed above said first groove and a polysilicon layer is formed on said second insulating film formed on said side walls of said first groove; and (6) the step of polishing the resultant surface of said bonded silicon substrate to obtain a flat surface;

thereby forming an island-like element formation region dielectrically isolated from another region by said first and second insulating films on said first monocrystalline silicon substrate.

2. A method of manufacturing a semiconductor device according to claim 1, wherein the step of forming said first groove from said other major surface of said bonded silicon substrate further comprises the steps of:

(a) forming a plurality of second grooves in a region on the other major surface of said first monocrystalline silicon substrate on which said island-like element formation region is to be formed, at the same time when said first groove is formed;

(b) forming third insulating films on the side walls and bottoms of said plurality of second grooves at the same time when said second insulating film is formed;

(c) forming a polysilicon layer on said third insulating film; and (d) polishing the resultant surface of said bonded silicon substrate to obtain a flat surface;

thereby forming respective island-like element formation regions dielectrically isolated from each other by said third insulating films in said island-like element formation region on said first monocrystalline silicon substrate.

3. A method according to claim 1, wherein said first monocrystalline silicon substrate is a silicon substrate of one conductivity type, and said second monocrystalline silicon substrate is a silicon substrate of said one conductivity type having a higher impurity concentration than that of said first monocrystalline silicon substrate.

4. A method according to claim 2, wherein said first monocrystalline silicon substrate is a silicon substrate of one conductivity type, and said second monocrystalline silicon substrate is a silicon substrate of said one conductivity type having a higher impurity concentration than that of said first monocrystalline silicon substrate.

5. A method according to claim 3, wherein an impurity region of said one conductivity type having a higher impurity concentration than that of said first monocrystalline silicon substrate is formed on said one major surface of said first monocrystalline silicon substrate before said first insulating film is formed.

6. A method according to claim 4, wherein an impurity region of said one conductivity type having a higher impurity concentration than that of said first monocrystalline silicon substrate is formed on said one major surface of said first monocrystalline silicon substrate before said first insulating film is formed.

* * * * *